US012597911B2

(12) United States Patent
    Hall et al.

(10) Patent No.:  US 12,597,911 B2
(45) Date of Patent:      Apr. 7, 2026

(54) SUPERCONDUCTING DATA INPUT SYSTEM

(71) Applicant: NORTHROP GRUMMAN SYSTEMS CORPORATION, Falls Church, VA (US)

(72) Inventors: Jeffrey S. Hall, Annapolis, MD (US); Elias J. Galan, Baltimore, MD (US)

(73) Assignee: NORTHROP GRUMMAN SYSTEMS CORPORATION, Falls Church, VA (US)

( * ) Notice: Subject to any disclaimer, the term of this patent is extended or adjusted under 35 U.S.C. 154(b) by 220 days.

(21) Appl. No.: 18/642,229

(22) Filed: Apr. 22, 2024

(65) Prior Publication Data

US 2026/0045940 A1     Feb. 12, 2026

(51) Int. Cl.
    *H03K 3/38*       (2006.01)
    *G06N 10/20*     (2022.01)
    *H03K 19/195*    (2006.01)

(52) U.S. Cl.
    CPC ............... *H03K 3/38* (2013.01); *G06N 10/20* (2022.01); *H03K 19/195* (2013.01)

(58) Field of Classification Search
    CPC ................................ H03K 3/38; H03K 17/92
    USPC .......................................... 327/186, 527, 528
    See application file for complete search history.

(56) References Cited

U.S. PATENT DOCUMENTS

| | | | |
|---|---|---|---|
| 5,345,115 | A | 9/1994 | Tokuda et al. |
| 10,243,582 | B1 | 3/2019 | Herr |
| 2019/0019938 | A1 | 1/2019 | Braun |
| 2021/0336610 | A1* | 10/2021 | Galan .................... H10N 60/12 |
| 2022/0344563 | A1 | 10/2022 | Comparan et al. |
| 2025/0167794 | A1* | 5/2025 | Burnett ............... H03M 1/1245 |

OTHER PUBLICATIONS

WOISR: "Notification of Transmittal of the International Search Report and the Written Opinion of the International Searching Authority, or the Declaration"; mailed on May 29, 2025 for corresponding PCT/US2025/015815.

* cited by examiner

*Primary Examiner* — Tomi Skibinski
(74) *Attorney, Agent, or Firm* — Tarolli, Sundheim, Covell & Tummino LLP

(57)                    ABSTRACT

One example includes a superconducting data input system. The system includes an inductive coupler that generates first and second bias currents in response to receiving a current pulse. The system also includes a first clocked receiver configured to generate a first superconducting data signal having a first data state in response to the first bias current at a first phase of a clock signal, and a second data state in response to not receiving the first bias current at the first phase of the clock signal. The system further includes a second clocked receiver configured to generate a second superconducting data signal having the first data state in response to the second bias current at a second phase of the clock signal different from the first phase, and having the second data state in response to not receiving the second bias current at the second phase of the clock signal.

20 Claims, 4 Drawing Sheets

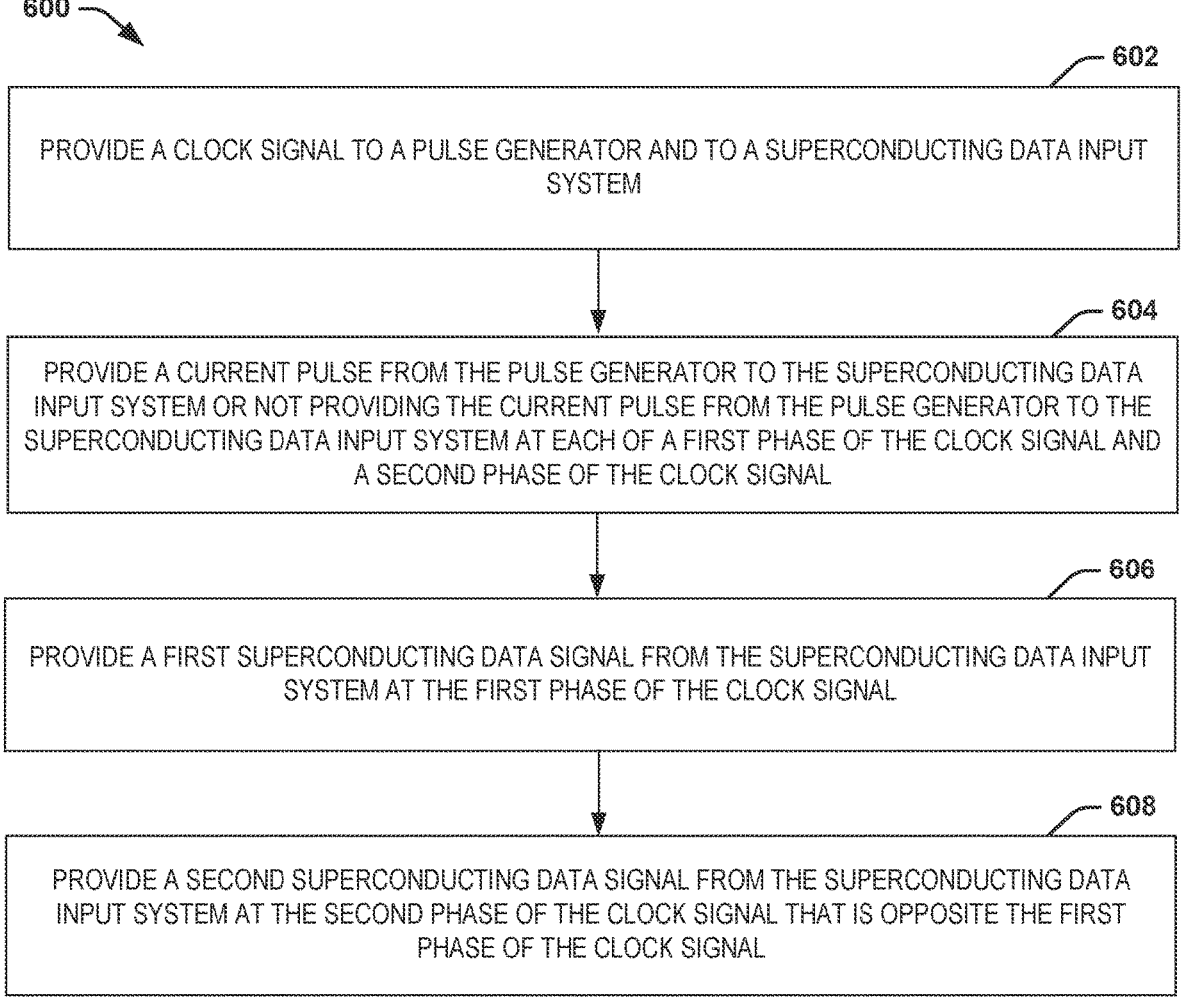

600

602

PROVIDE A CLOCK SIGNAL TO A PULSE GENERATOR AND TO A SUPERCONDUCTING DATA INPUT SYSTEM

604

PROVIDE A CURRENT PULSE FROM THE PULSE GENERATOR TO THE SUPERCONDUCTING DATA INPUT SYSTEM OR NOT PROVIDING THE CURRENT PULSE FROM THE PULSE GENERATOR TO THE SUPERCONDUCTING DATA INPUT SYSTEM AT EACH OF A FIRST PHASE OF THE CLOCK SIGNAL AND A SECOND PHASE OF THE CLOCK SIGNAL

606

PROVIDE A FIRST SUPERCONDUCTING DATA SIGNAL FROM THE SUPERCONDUCTING DATA INPUT SYSTEM AT THE FIRST PHASE OF THE CLOCK SIGNAL

608

PROVIDE A SECOND SUPERCONDUCTING DATA SIGNAL FROM THE SUPERCONDUCTING DATA INPUT SYSTEM AT THE SECOND PHASE OF THE CLOCK SIGNAL THAT IS OPPOSITE THE FIRST PHASE OF THE CLOCK SIGNAL

FIG. 6

SUPERCONDUCTING DATA INPUT SYSTEM

GOVERNMENT INTEREST

The invention was made under Government Contract. Therefore, the U.S. Government has rights to the invention as specified in that contract.

TECHNICAL FIELD

The present invention relates generally to computer systems, and specifically to a superconducting data input system.

BACKGROUND

Superconducting digital technology has provided computing and/or communications resources that benefit from unprecedented high speed, low power dissipation, and low operating temperature. Superconducting digital technology has been developed as an alternative to CMOS technology, and typically comprises superconductor based single flux a superconducting circuit, utilizing superconducting Josephson junctions, and can exhibit typical signal power dissipation of less than 1 nW (nanowatt) per active device at a typical data rate of 20 Gb/s (gigabytes/second) or greater, and can operate at temperatures of around 4 Kelvin.

Some superconducting circuits implement bias signals to trigger Josephson junctions to propagate single flux quantum (SFQ) pulses. Like traditional CMOS technology, data can be transferred in superconducting circuits based on an oscillating clock signal. Therefore, logic operations and other time-dependent signal transfer can occur in superconducting circuits based on the clock signal. One such example of superconducting circuits is reciprocal quantum logic (RQL), in which an AC clock signal provides the bias signals to trigger and untrigger the Josephson junctions, such as in a sequential sequence that is timed to specific phases of the AC clock signal. Additionally, superconducting circuits typically operate in conjunction with classical computer systems, thereby providing data transfer between the classical computer system(s) and the superconducting circuit.

SUMMARY

One example includes a superconducting data input system. The system includes an inductive coupler that generates first and second bias currents in response to receiving a current pulse. The system also includes a first clocked receiver configured to generate a first superconducting data signal having a first data state in response to the first bias current at a first phase of a clock signal, and a second data state in response to not receiving the first bias current at the first phase of the clock signal. The system further includes a second clocked receiver configured to generate a second superconducting data signal having the first data state in response to the second bias current at a second phase of the clock signal different from the first phase, and having the second data state in response to not receiving the second bias current at the second phase of the clock signal.

Another example includes a method for reading a generating superconducting data. The method includes providing a clock signal to a pulse generator and to a superconducting data input system and providing a current pulse from the pulse generator to the superconducting data input system or not providing the current pulse from the pulse generator to the superconducting data input system at each of a first phase of the clock signal and a second phase of the clock signal. The method also includes providing a first superconducting data signal from the superconducting data input system at the first phase of the clock signal, the first superconducting data signal having a first data state in response to the current pulse being provided at the first phase of the clock signal and having a second data state in response to the current pulse not being provided at the first phase of the clock signal. The method further includes providing a second superconducting data signal from the superconducting data input system at the second phase of the clock signal that is opposite the first phase of the clock signal, the second superconducting data signal having the first data state in response to the current pulse being provided at the second phase of the clock signal and having the second data state in response to the current pulse not being provided at the second phase of the clock signal.

Another example includes a superconducting circuit system. The system includes a pulse generator that generates a current pulse or does not generate the current pulse at each of a first phase of the clock signal and a second phase of the clock signal that is opposite the first phase. The system further includes a superconducting circuit and a superconducting data input system. The superconducting data input system includes an inductive coupler that generates a first bias current and a second bias current in response to receiving the current pulse. The superconducting data input system also includes a first clocked receiver configured to provide a first superconducting data signal to the superconducting circuit, the first superconducting data signal having a first data state in response to the first bias current at the first phase of the clock signal and having a second data state in response to not receiving the first bias current at the first phase of the clock signal. The superconducting data input system further includes a second clocked receiver configured to provide a second superconducting data signal to the superconducting circuit, the second superconducting data signal having the first data state in response to the second bias current at the second phase of the clock signal, and having the second data state in response to not receiving the second bias current at the second phase of the clock signal.

BRIEF DESCRIPTION OF THE DRAWINGS

FIG. 6 illustrates an example of a method for reading a superconducting input signal.

DETAILED DESCRIPTION

Figure 1:
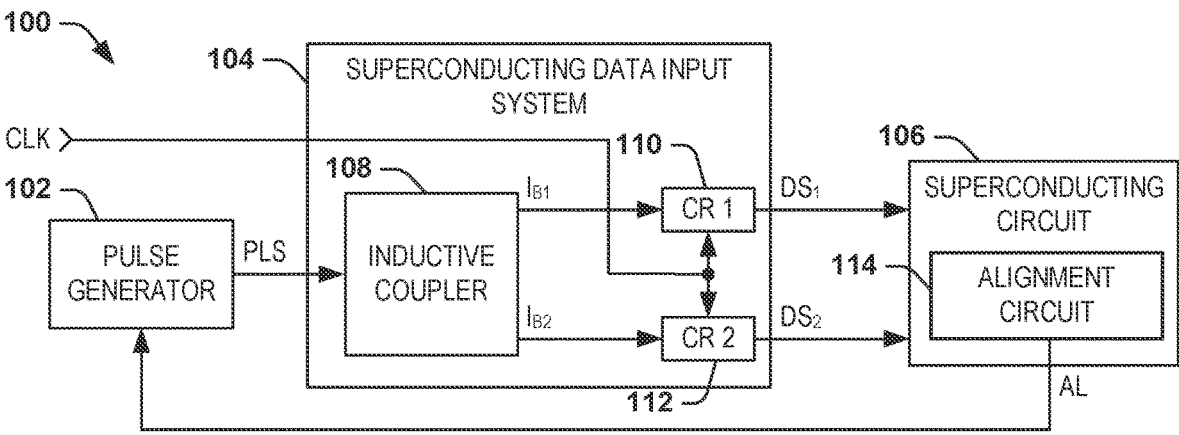
FIG. 1 illustrates an example block diagram of a superconducting data system.

The present invention relates generally to computer systems, and specifically to a superconducting data input system. The superconducting data input system can be implemented in any of a variety of computer devices, such as to operate as an interface between a classical computer and a superconducting circuit. For example, the superconducting data input system can provide the interface between circuitry that is arranged in room-temperature space (e.g., a complementary metal-oxide semiconductor (CMOS) circuit) and cryogenic temperature space (e.g., a superconducting cir-
cuit). As described herein, the superconducting data input
system can be configured to provide superconducting data at
a double data rate. As described herein, the term "double
data rate" refers to providing a pair of binary superconduct-
ing data signals at each cycle (e.g., period) of a clock signal.

The superconducting data input system is configured to
receive a current pulse or not receive a current pulse at each
of a first phase and a second phase of a clock signal. As
described herein, the term "phase of the clock signal" refers
to a range of angular phases along the period of the clock
signal. For example, each of the first and second phase of the
clock signal can be approximately half the period (e.g.,
180°) of the clock signal. The first phase and the second
phase can be opposite phases of the clock signal, such that
the first phase can occupy approximately a first half of the
period of the clock signal and the second phase can occupy
approximately a second half of the clock signal. Therefore,
the peak amplitude of the second phase of the clock signal
can be 180° out-of-phase of the peak amplitude of the first
phase of the clock signal.

As an example, the current pulse can be provided from a
pulse generator, such as included in a classical computer
system that is arranged in a room-temperature space. The
current pulses can thus be provided to indicate a data state
that is provided in each of the first and second phases of the
clock signal. As an example, the current pulse can be
provided to indicate a first data state (e.g., logic-1) for a
given one of the first and second phases of the clock signal,
and a lack of a current pulse can indicate a second data state
(e.g., logic-0) for a given one of the first and second phases
of the clock signal. The superconducting data input system
includes an inductive coupler that is configured to generate
a first bias current and a second bias current in response to
the current pulse. For example, the inductive coupler can
include a pair of inductive couplings that are each config-
ured to generate the respective one of the first and second
bias currents in response to the current pulse.

The superconducting data input system can include a first
clocked receiver and a second clocked receiver that are each
configured to receive the clock signal. The first clocked
receiver can be coupled to the inductive coupler to receive
the first bias current, and can be configured to generate a first
superconducting data signal during the first phase of the
clock signal. The second clocked receiver can be coupled to
the inductive coupler to receive the second bias current, and
can be configured to generate a second superconducting data
signal during the second phase of the clock signal.

For example, each of the clocked receivers can be con-
figured as Josephson transmission lines (JTLs) that include
at least one Josephson junction. The clock signal can be
configured to bias the Josephson junction(s) in each of the
first and second clocked receivers, such that the first phase
of the clock signal can provide a positive bias to the first
clocked receiver and the second phase of the clock signal
can provide a positive bias to the second clocked receiver.
Accordingly, in response to the first bias current, the Joseph-
son junction(s) of the first clocked receiver can trigger to
generate a reciprocal quantum logic (RQL) pulse during the
first phase of the clock signal. As described herein, the term
"RQL pulse" refers to a fluxon (positive single flux quantum
(SFQ) pulse) followed by a complementary phase-delayed
antifluxon (negative SFQ pulse). Similarly, in response to
the second bias current, the Josephson junction(s) of the
second clocked receiver can trigger to generate an RQL
pulse during the second phase of the clock signal. The RQL
pulse can thus indicate the first data state of the respective one of the first and second superconducting data signals, and
the lack of an RQL pulse can thus indicate the second data
state of the respective one of the first and second supercon-
ducting data signals.

The first and second superconducting data signals can
thus be provided as inputs to a superconducting circuit, such
as to provide an intended operational function. As a result,
the superconducting data input system can be configured to
provide two superconducting data signals at each period of
the clock signal in a double data rate manner. As an example,
the clock signal can also drive the pulse generator. In this
example, the superconducting circuit can also include an
alignment circuit that is configured to provide an alignment
signal to the pulse generator, such that the pulse generator
can be configured to align the current pulses to an approxi-
mate center (e.g., peak amplitude) of the first and second
phases of the clock signal, thereby mitigating timing errors.

FIG. 1 illustrates an example block diagram of a super-
conducting data system 100. The superconducting data input
system 104 can be implemented in any of a variety of
computer devices, such as to operate as an interface between
a classical computer and a superconducting circuit. For
example, the superconducting data input system can provide
the interface between circuitry that is arranged in room-
temperature space (e.g., a complementary metal-oxide semi-
conductor (CMOS) circuit) and cryogenic temperature space
(e.g., a superconducting circuit).

The superconducting data system 100 includes a pulse
generator 102, a superconducting data input system 104, and
a superconducting circuit 106. The pulse generator 102 can,
for example, be arranged outside of the cryogenic tempera-
ture space (e.g., in a room temperature space). The pulse
generator 102 is provided a clock signal CLK as an input,
and is configured to generate a current pulse PLS or to not
generate a current pulse PLS at each of a first phase of the
clock signal CLK and a second phase of the clock signal
CLK that is opposite the first phase. The first phase and the
second phase can be opposite phases of the clock signal
CLK, such that the first phase can occupy approximately a
first half of the period of the clock signal CLK and the
second phase can occupy approximately a second half of the
clock signal CLK. Therefore, the peak amplitude of the
second phase of the clock signal CLK can be 180° out-of-
phase of the peak amplitude of the first phase of the clock
signal CLK. As an example, the presence of a current pulse
PLS can be indicative of a first data state (e.g., logic-1) at the
respective one of the phases of the clock signal CLK, and the
absence of the current pulse PLS can be indicative of a
second data state (e.g., logic-0) at the respective one of the
phases of the clock signal CLK.

The superconducting data input system 104 can be
arranged in a cryogenic temperature space to facilitate
superconducting data transfer. The superconducting data
input system 104 is configured to receive the current pulse
PLS or to not receive a current pulse PLS at each of the first
and second phases of the clock signal CLK. In the example
of FIG. 1, the superconducting data input system 104
includes an inductive coupler 108 that is configured to
generate a first bias current $IB_1$ and a second bias current $IB_2$
in response to the current pulse PLS. For example, the
inductive coupler 108 can include a pair of inductive cou-
plings that are each configured to generate the respective one
of the first and second bias currents $IB_1$ and $IB_2$ in response
to the current pulse PLS.

The superconducting data input system 104 can include a
first clocked receiver 110 and a second clocked receiver 112
that are each configured to receive the clock signal CLK. As described in greater detail herein, the first and second clocked receivers 110 and 112 can each be configured as Josephson transmission lines (JTLs) that include at least one Josephson junction, thereby operating in reciprocal quantum logic (RQL). The first clocked receiver 110 can be coupled to the inductive coupler 108 to receive the first bias current $IB_1$. The first clocked receiver 110 can thus be configured to generate a first superconducting data signal $DS_1$ during the first phase of the clock signal CLK. The second clocked receiver 112 can be coupled to the inductive coupler 108 to receive the second bias current $IB_2$. The second clocked receiver 112 can thus be configured to generate a second superconducting data signal $DS_2$ during the second phase of the clock signal CLK.

The presence or absence of the current pulse PLS during a given one of the phases of the clock signal CLK can be indicative of the data state of the respective one of the first and second superconducting data signals $DS_1$ and $DS_2$. Therefore, if the current pulse PLS is present during the first or second phase of the clock signal CLK, the respective one of the first and second superconducting data signals $DS_1$ and $DS_2$ can be provided in the first data state. However, if the current pulse PLS is not present during the first or second phase of the clock signal CLK, the respective one of the first and second superconducting data signals $DS_1$ and $DS_2$ can be provided in the second data state.

The first and second superconducting data signals $DS_1$ and $DS_2$ can thus be provided as inputs to the superconducting circuit 106. Therefore, the superconducting circuit 106 can be configured to perform an intended operational function based on the first and second superconducting data signals $DS_1$ and $DS_2$. As a result, the superconducting data input system 104 can be configured to provide two superconducting data signals, the first and second superconducting data signals $DS_1$ and $DS_2$, at each period of the clock signal CLK in a double data rate manner.

As demonstrated in the example of FIG. 1, the superconducting circuit 106 includes an alignment circuit 114. As an example, before establishing digital communication between the pulse generator 102 and the superconducting circuit 106 via the superconducting data input system 104, the superconducting data system 100 can initiate an initial training period. During the initial training period, the pulse generator 102 can be configured to provide the current pulse PLS as a training pulse. The superconducting data input system 104 thus provides one of the first and second superconducting data signals $DS_1$ and $DS_2$ to the alignment circuit 114. The alignment circuit 114 can thus identify which phase of the clock signal CLK that the training pulse was provided by the pulse generator 102. As an example, the alignment circuit 114 can also determine a more specific phase of the training pulse within the phase window of the respective one of the phases of the clock signal CLK (e.g., based on comparing the respective one of the first and second superconducting data signals $DS_1$ and $DS_2$ to multiple phases of the full quadrature RQL clock).

In response to determining the approximate phase of the respective one of the first and second superconducting data signals $DS_1$ and $DS_2$, and thus the approximate phase of the current pulse PLS provided as the training pulse, the alignment circuit 114 can provide an alignment signal AL as a feedback signal back to the pulse generator 102. The pulse generator 102 can thus adjust the timing of the current pulse PLS for when the current pulse PLS is provided. For example, the pulse generator 102 can shift the timing of the current pulse PLS, such that the bias currents $IB_1$ and $IB_2$ are provided at approximately the peak amplitude of the first and second phases of the clock signal CLK, as received by the superconducting data input system 104. Therefore, the bias currents $IB_1$ and $IB_2$ generated by the current pulse PLS can be provided at a highest amplitude of bias provided by the clock signal CLK to the first and second clocked receivers 110 and 112. Accordingly, the superconducting data system 100 can operate with optimal timing margins, thereby mitigating errors (e.g., resulting from the pulse width of the bias currents $IB_1$ and $IB_2$ spanning both phases of the clock signal CLK). As a result, the superconducting data system 100 can operate effectively to provide data transfer accurately to the superconducting circuit 106.

Figure 2:
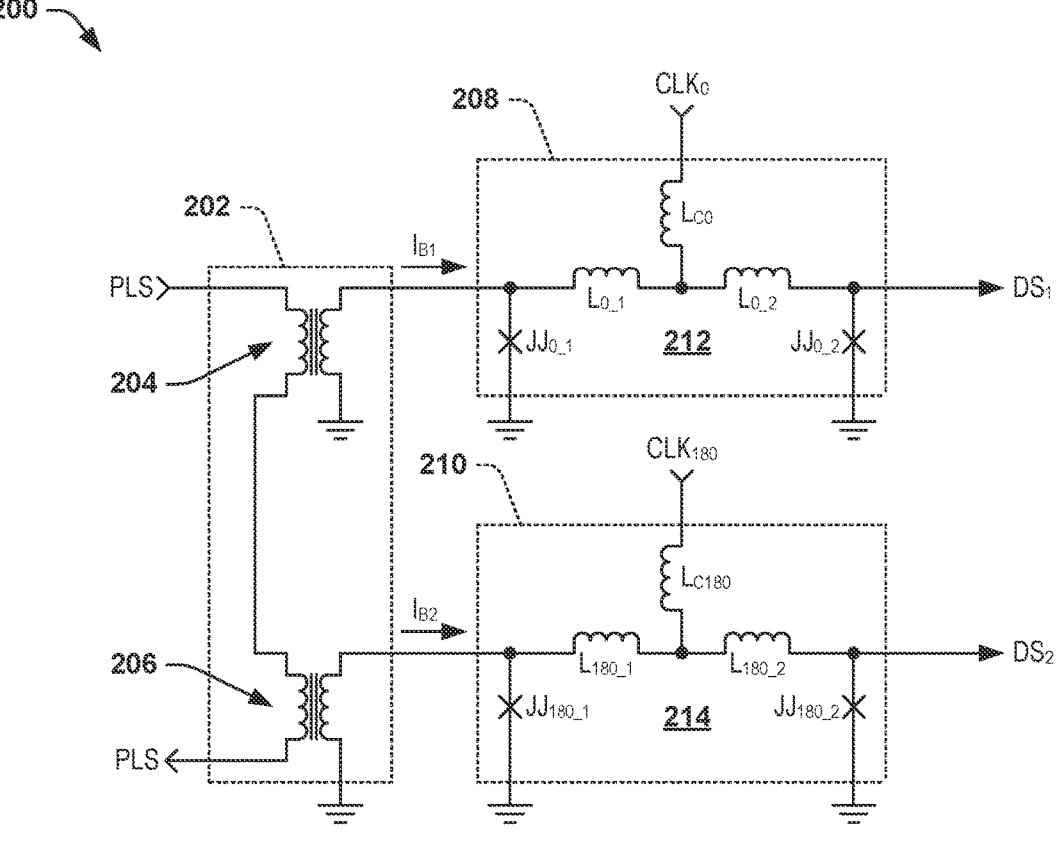
FIG. 2 illustrates an example circuit diagram of a superconducting data input system.

FIG. 2 illustrates an example circuit diagram of a superconducting data input system 200. The superconducting data input system 200 can correspond to the superconducting data input system 104 in the example of FIG. 1. Therefore, reference is to be made to the example of FIG. 1 in the following description of the example of FIG. 2. As an example, the superconducting data input system 200 can be implemented in or as a part of an integrated circuit (IC), such as the same IC that includes the superconducting circuit (e.g., the superconducting circuit 106).

The superconducting data input system 200 includes an inductive coupler 202 that is configured to generate a first bias current $IB_1$ and a second bias current $IB_2$ in response to the current pulse PLS (e.g., provided from the pulse generator 102). In the example of FIG. 2, the inductive coupler 202 includes a first inductive coupling 204 and a second inductive coupling 206. The first inductive coupling 204 is configured to inductively generate the first bias current $IB_1$ in response to the current pulse PLS, and the second inductive coupling 206 is configured to concurrently inductively generate the second bias current $IB_2$ in response to the current pulse PLS. Therefore, as the current pulse PLS is provided through the inductive coupler 202, the first and second bias currents $IB_1$ and $IB_2$ are concurrently inductively provided from the inductive coupler 202 in response to the current pulse PLS.

The superconducting data input system 200 can include a first JTL 208 and a second JTL 210 that are each configured to receive the clock signal CLK. The first JTL 208 is demonstrated as providing the first superconducting data signal $DS_1$ as an output, and the second JTL 210 is demonstrated as providing the second superconducting data signal $DS_2$ as an output. In the example of FIG. 2, the first JTL 208 includes a first Josephson junction $JJ_{0\_1}$, a first inductor $L_{0\_1}$, a second inductor $L_{0\_2}$, and a second Josephson junction $JJ_{0\_2}$. The first and second Josephson junctions $JJ_{0\_1}$ and $JJ_{0\_2}$ and the first and second inductors $L_{0\_1}$ and $L_{0\_2}$ are arranged to form a first superconducting quantum interference device (SQUID) 212. The first JTL 208 also includes a clock inductor LC0 that is configured to receive the clock signal CLK. In the example of FIG. 2, the clock signal CLK is provided to the first JTL 208 in a manner to provide a positive bias in the first phase of the clock signal CLK, and is thus demonstrated as a clock signal $CLK_0$.

Similarly, in the example of FIG. 2, the second JTL 210 includes a first Josephson junction $JJ_{180\_1}$, a first inductor $L_{180\_1}$, a second inductor $L_{180\_2}$, and a second Josephson junction $JJ_{180\_2}$. The first and second Josephson junctions $JJ_{180\_1}$ and $JJ_{180\_2}$ and the first and second inductors $L_{180\_1}$ and $L_{180\_2}$ are arranged to form a second SQUID 214. The second JTL 210 also includes a clock inductor LC180 that is configured to receive the clock signal CLK. In the example of FIG. 2, the clock signal CLK is provided to the second JTL 210 in a manner to provide a positive bias in the second phase of the clock signal CLK opposite the first phase, and is thus demonstrated as a clock signal $CLK_{180}$.

During the first phase of the clock signal CLK, the clock signal $CLK_0$ is exhibiting a positive amplitude to bias the Josephson junctions $JJ_{0\_1}$ and $JJ_{0\_2}$ in the first JTL 208. Therefore, in response to the current pulse PLS being provided to the inductive coupler 202, the first inductive coupling 204 generates the first bias current $IB_1$. The combination of the first bias current $IB_1$ and the bias provided by the clock signal $CLK_0$ is sufficient to trigger the Josephson junctions $JJ_{0\_1}$ and $JJ_{0\_2}$. Therefore, the triggering of the Josephson junctions $JJ_{0\_1}$ and $JJ_{0\_2}$ results in an RQL pulse being provided as the first superconducting data signal $DS_1$. As an example, the RQL pulse can be indicative of a first data state (e.g., logic-1) of the first superconducting data signal $DS_1$. Conversely, during the first phase of the clock signal CLK, if the current pulse PLS is not provided, the positive amplitude of the clock signal $CLK_0$ is insufficient to trigger the Josephson junctions $JJ_{0\_1}$ and $JJ_{0\_2}$ in the absence of the first bias current $IB_1$. As a result, no RQL pulse is provided during the first phase of the clock signal CLK, which can be indicative of a second data state (e.g., logic-0) of the first superconducting data signal $DS_1$.

During the second phase of the clock signal CLK, the clock signal $CLK_{180}$ is exhibiting a positive amplitude to bias the Josephson junctions $JJ_{180\_1}$ and $JJ_{180\_2}$ in the second JTL 210. Therefore, in response to the current pulse PLS being provided to the inductive coupler 202, the second inductive coupling 206 generates the second bias current $IB_2$. The combination of the second bias current $IB_2$ and the bias provided by the clock signal $CLK_{180}$ is sufficient to trigger the Josephson junctions $JJ_{180\_1}$ and $JJ_{180\_2}$. Therefore, the triggering of the Josephson junctions $JJ_{180\_1}$ and $JJ_{180\_2}$ results in an RQL pulse being provided as the second superconducting data signal $DS_2$. As an example, the RQL pulse can be indicative of a first data state (e.g., logic-1) of the second superconducting data signal $DS_2$. Conversely, during the second phase of the clock signal CLK, if the current pulse PLS is not provided, the positive amplitude of the clock signal $CLK_{180}$ is insufficient to trigger the Josephson junctions $JJ_{180\_1}$ and $JJ_{180\_2}$ in the absence of the second bias current $IB_2$. As a result, no RQL pulse is provided during the second phase of the clock signal CLK, which can be indicative of a second data state (e.g., logic-0) of the second superconducting data signal $DS_2$.

The superconducting data input system 200 therefore demonstrates an interface to RQL circuitry that can provide RQL data in a double data rate. In the example of FIG. 2, the first and second superconducting data signals $DS_1$ and $DS_2$ each provide a data bit during a single period of the clock signal CLK. The data state of each of the superconducting data signals $DS_1$ and $DS_2$ is therefore based on the presence of absence of the current pulse PLS in each of the respective first and second phases of the clock signal CLK. The first and second superconducting data signals $DS_1$ and $DS_2$ can thus be provided as inputs to a superconducting circuit (e.g., the superconducting circuit 106). Therefore, the associated superconducting circuit can be configured to perform an intended operational function based on the first and second superconducting data signals $DS_1$ and $DS_2$. As a result, the superconducting data input system 200 can be configured to provide the first and second superconducting data signals $DS_1$ and $DS_2$ at each period of the clock signal CLK in a double data rate manner.

As an example, the clock signals $CLK_0$ and $CLK_{180}$ can be provided based on an RQL clock signal. Thus, the clock signals $CLK_0$ and $CLK_{180}$ can be provided from one of the in-phase or quadrature-phase component of the RQL clock signal. The in-phase or quadrature-phase component of the RQL clock signal can be inductively provided to the respective first JTL 208 and the second JTL 210. Therefore, the one of the in-phase or quadrature-phase component of the RQL clock signal can be provided to the first and second JTLs 208 and 210 in opposite polarities to provide the respective clock signals $CLK_0$ and $CLK_{180}$. Therefore, the clock signals $CLK_0$ and $CLK_{180}$ can be 180° out-of-phase of each other (e.g., 0° and 180° or 90° and 270°). Additionally, each of the clock signals $CLK_0$ and $CLK_{180}$ can include a DC component having an amplitude that is sufficient to trigger the Josephson junctions $JJ_{0\_1}$ and $JJ_{0\_2}$ and $JJ_{180\_1}$ and $JJ_{180\_2}$ in response to the respective bias currents $IB_1$ and $IB_2$ at any phase in the approximate 180° positive-polarity phase window of the respective first and second phases of the clock signal CLK.

Figure 3:
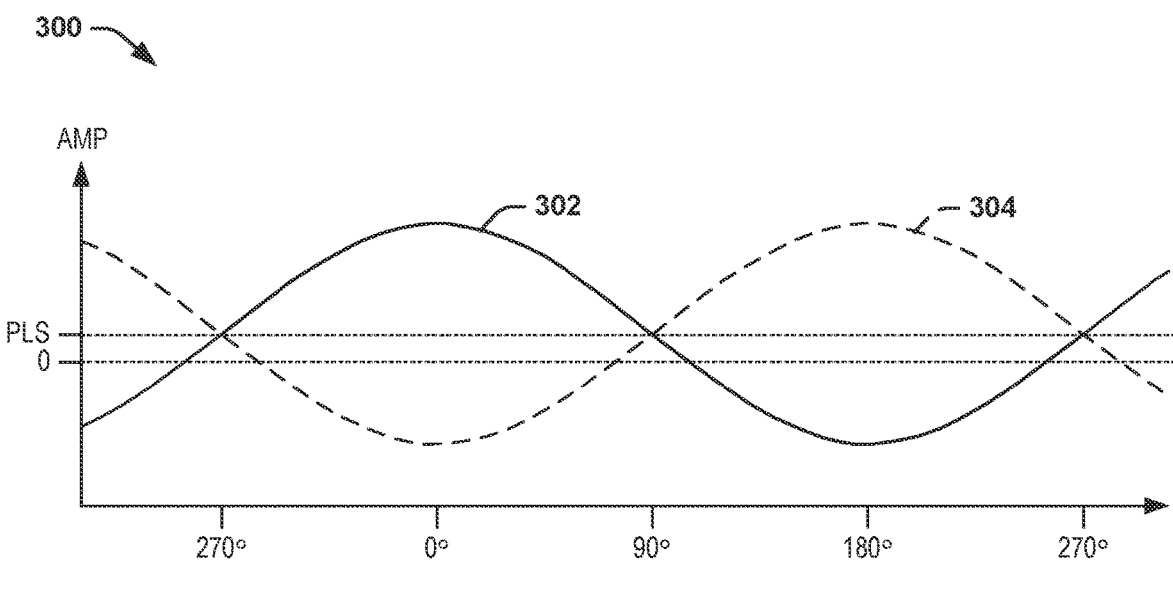
FIG. 3 illustrates an example of a phase diagram.

FIG. 3 illustrates an example of a phase diagram 300. The phase diagram 300 demonstrates a plot of amplitude AMP as a function of phase. The phase diagram 300 includes a first phase of the clock signal CLK, demonstrated as a solid line at 302, and the second phase of the clock signal CLK, demonstrated as a dashed line at 304. The first and second phases 302 and 304 of the clock signal CLK can correspond, respectively, to the first and second clock signals $CLK_0$ and $CLK_{180}$. Therefore, reference is to be made to the examples of FIGS. 1 and 2 in the following description of the example of FIG. 3.

In the example of FIG. 3, the first and second phases 302 and 304 of the clock signal CLK are demonstrated as having an opposite phase, and are thus demonstrated as being 180° out-of-phase with respect to each other. As an example, the first and second phases 302 and 304 of the clock signal CLK can be generated from the same clock signal (e.g., the in-phase or quadrature-phase component of the RQL clock signal), such that the second clock signal 304 can be provided based on the first clock signal 302 being provided in reverse polarity through an inductive coupling. Also in the example of FIG. 3, the first and second phases 302 and 304 of the clock signal CLK are demonstrated as having a DC offset relative to zero amplitude. Thus, the nodes of the first and second phases 302 and 304 of the clock signal CLK are demonstrated as having an amplitude of ADC that is greater than zero.

The DC offset is demonstrated as an amplitude PLS that can correspond to a sufficient bias amplitude of the clock signals 302 and 304 for triggering the Josephson junctions $JJ_{0\_1}$ and $JJ_{0\_2}$ and $JJ_{180\_1}$ and $JJ_{180\_2}$ of the first and second JTLs 208 and 210 when combined with the respective first and second bias currents $IB_1$ and $IB_2$. The sufficient bias amplitude PLS thus defines a phase window of the respective clock signals 302 and 304 that spans approximately 180° in phase-width centered about the peak amplitudes of the clock signals 302 and 304, demonstrated at 0° and 180°, respectively.

Therefore, if the bias current $IB_1$ is provided during the first phase of the clock signal CLK, and thus between approximately 270° and 90°, the Josephson junctions $JJ_{0\_1}$ and $JJ_{0\_2}$ trigger to generate an RQL pulse, and thus the first data state of the first superconducting data signal $DS_1$. However, the Josephson junctions $JJ_{180\_1}$ and $JJ_{180\_2}$ do not trigger in response to the bias current $IB_1$ based on the negative amplitude of the clock signal 304. Similarly, if the bias current $IB_2$ is provided during the second phase of the clock signal CLK, and thus between approximately 90° and 270°, the Josephson junctions $JJ_{180\_1}$ and $JJ_{180\_2}$ trigger to generate an RQL pulse, and thus the first data state of the second superconducting data signal $DS_2$. However, the Josephson junctions $JJ_{0\_1}$ and $JJ_{0\_2}$ do not trigger in response to the bias current $IB_2$ based on the negative amplitude of the clock signal 302.

Figure 4:
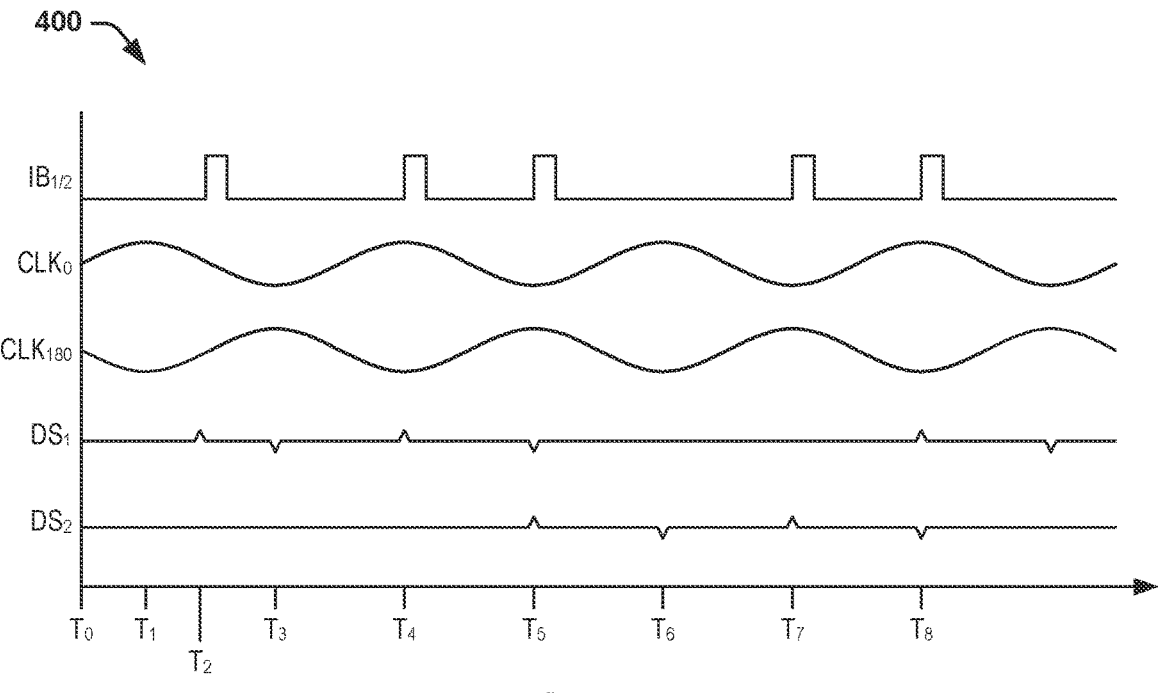
FIG. 4 illustrates an example of a timing diagram.

FIG. 4 illustrates an example of a timing diagram 400. The timing diagram 400 can correspond to operation of the superconducting data system 100 in the example of FIG. 1 and the superconducting data input system 200 in the example of FIG. 2. Therefore, reference is to be made to the examples of FIGS. 1-3 in the following description of the example of FIG. 4.

The timing diagram 400 includes the first and second bias currents $IB_1$ and $IB_2$, demonstrated collectively as a signal $IB_1$. The timing diagram 400 also includes the first clock signal $CLK_0$ and the second clock signal $CLK_{180}$. The first and second clock signals $CLK_0$ and $CLK_{180}$ can correspond to a single clock signal CLK (e.g., one of the in-phase and quadrature-phase components of the RQL clock signal) that is provided in opposite polarities with respect to the first and second JTLs 208 and 210, and are therefore demonstrated in opposite phases with respect to each other. The timing diagram 400 further demonstrates the first superconducting data signal $DS_1$ and the second superconducting data signal $DS_2$. The first and second superconducting data signals $DS_1$ and $DS_2$ are demonstrated in the example of FIG. 4 as an RQL pulse in a first data state and a lack of an RQL pulse in a second data state.

The timing diagram 400 begins at a time $T_0$ that corresponds to a beginning of the first phase of the clock signal CLK, and thus the beginning of the phase window at which the first clock signal $CLK_0$ is positive. At a time $T_1$, the first clock signal $CLK_0$ has a peak amplitude, with the second clock signal $CLK_{180}$ having a complementary negative peak amplitude. At a time $T_2$, the bias currents $IB_{1/2}$ are provided to the first and second JTLs 208 and 210, such as in response to the current pulse PLS being provided from the pulse generator 102 at a time just prior to the time $T_2$. The combination of the bias provided to the Josephson junctions $JJ_{0\_1}$ and $JJ_{0\_2}$ from the positive amplitude of the first clock signal $CLK_0$ and the bias current $IB_1$ can be sufficient to trigger the Josephson junctions $JJ_{0\_1}$ and $JJ_{0\_2}$. Therefore, at the time $T_2$, an RQL pulse is provided as the first superconducting data signal $DS_1$. Because the time $T_2$ at which the bias currents $IB_{1/2}$ are provided is in the first phase of the clock signal CLK, the Josephson junctions $JJ_{180\_1}$ and $JJ_{180\_2}$ do not trigger based on the negative amplitude of the second clock signal $CLK_{180}$.

As an example, the current pulse PLS that is provided at approximately the time $T_2$ can be an initial training pulse. The superconducting data input system 200 thus provides the RQL pulse of the first superconducting data signal $DS_1$ to an alignment circuit (e.g., the alignment circuit 114). The alignment circuit can thus identify that RQL pulse was generated in the first phase of the clock signal CLK (e.g., based on being provided as the first superconducting data signal $DS_1$). As an example, the alignment circuit can also identify a relative phase of the RQL pulse within the phase window of the first phase of the clock signal CLK. The alignment circuit can thus provide an alignment signal (e.g., the alignment signal AL) as a feedback signal back to the pulse generator 102. The pulse generator 102 can thus adjust the timing of the current pulse PLS for when the current pulse PLS is provided based on the clock signal CLK that is also provided to the pulse generator 102. Therefore, the pulse generator 102 can shift the timing of the current pulse PLS, such that the bias currents $IB_{1/2}$ are provided at approximately the peak amplitude of the first and second phases of the clock signal CLK, as received by the superconducting data input system 200.

At a time $T_3$, the second clock signal $CLK_{180}$ has a peak amplitude, with the first clock signal $CLK_0$ having a complementary negative peak amplitude. At the time $T_3$, the antifluxon of the RQL pulse generated at the time $T_2$ is generated. In the example of FIG. 4, the antifluxon of each RQL pulse of the first and second superconducting data signals $DS_1$ and $DS_2$ is generated at the 180° subsequent phase complementary negative peak amplitude. Therefore, the generation of the antifluxon of each RQL pulse is given, and is thus not described hereinafter.

At a time prior to a time $T_4$, the initial training period is concluded, and the alignment signal is considered to have aligned the timing of the current pulse PLS. At the time $T_4$, the bias currents $IB_{1/2}$ are provided to the first and second JTLs 208 and 210 in response to the current pulse PLS being provided from the pulse generator 102 at a time just prior to the time $T_4$. The time $T_4$ is also a time at which the first clock signal $CLK_0$ has a peak amplitude, with the second clock signal $CLK_{180}$ having a complementary negative peak amplitude. Therefore, the time $T_4$ occurs during the first phase of the clock signal CLK. Accordingly, the bias currents $IB_{1/2}$ are approximate aligned to the peak amplitudes of the clock signals $CLK_0$ and $CLK_{180}$ in response to the alignment signal. The combination of the bias provided to the Josephson junctions $JJ_{0\_1}$ and $JJ_{0\_2}$ from the positive amplitude of the first clock signal $CLK_0$ and the bias current $IB_1$ can be sufficient to trigger the Josephson junctions $JJ_{0\_1}$ and $JJ_{0\_2}$. Therefore, at the time $T_4$, an RQL pulse is provided as the first superconducting data signal $DS_1$. As a result, the first superconducting data signal $DS_1$ is provided to the superconducting circuit 106 at the first data state at the time $T_4$.

At a time $T_5$, the bias currents $IB_{1/2}$ are provided to the first and second JTLs 208 and 210 in response to the current pulse PLS being provided at a time just prior to the time $T_5$. The time $T_5$ is also a time at which the second clock signal $CLK_{180}$ has a peak amplitude, with the first clock signal $CLK_0$ having a complementary negative peak amplitude. Therefore, the time $T_5$ occurs during the second phase of the clock signal CLK. The combination of the bias provided to the Josephson junctions $JJ_{180\_1}$ and $JJ_{180\_2}$ from the positive amplitude of the second clock signal $CLK_{180}$ and the bias current $IB_2$ can be sufficient to trigger the Josephson junctions $JJ_{180\_1}$ and $JJ_{180\_2}$. Therefore, at the time $T_5$, an RQL pulse is provided as the second superconducting data signal $DS_2$. As a result, the second superconducting data signal $DS_2$ is provided to the superconducting circuit 106 at the first data state at the time $T_5$.

At a time $T_6$, the first clock signal $CLK_0$ has a peak amplitude, with the second clock signal $CLK_{180}$ having a complementary negative peak amplitude. Therefore, the time $T_6$ occurs during the first phase of the clock signal CLK. However, at the time $T_6$, the current PLS is not provided, and the bias currents $IB_{1/2}$ are not provided to the first and second JTLs 208 and 210. Thus, the first clock signal $CLK_0$ has insufficient amplitude absent the first bias current $IB_1$ to trigger the Josephson junctions $JJ_{0\_1}$ and $JJ_{0\_2}$. Accordingly, no RQL pulse is generated by the first JTL 208. As a result, the first superconducting data signal $DS_1$ is provided to the superconducting circuit 106 at the second data state at the time $T_6$.

At a time $T_7$, the bias currents $IB_{1/2}$ are provided to the first and second JTLs 208 and 210 in response to the current pulse PLS being provided at a time just prior to the time $T_7$. The time $T_7$ is also a time at which the second clock signal $CLK_{180}$ has a peak amplitude, with the first clock signal $CLK_0$ having a complementary negative peak amplitude. Therefore, the time $T_7$ occurs during the second phase of the clock signal CLK. The combination of the bias provided to the Josephson junctions $JJ_{180\_1}$ and $JJ_{180\_2}$ from the positive amplitude of the second clock signal $CLK_{180}$ and the bias current $IB_2$ can be sufficient to trigger the Josephson junctions $JJ_{180\_1}$ and $JJ_{180\_2}$. Therefore, at the time $T_7$, an RQL pulse is provided as the second superconducting data signal $DS_2$. As a result, the second superconducting data signal $DS_2$ is provided to the superconducting circuit 106 at the first data state at the time $T_7$.

At a time prior to a time $T_8$, the bias currents $IB_{1/2}$ are provided to the first and second JTLs 208 and 210 in response to the current pulse PLS being provided just prior to the time $T_8$. The time $T_8$ is also a time at which the first clock signal $CLK_0$ has a peak amplitude, with the second clock signal $CLK_{180}$ having a complementary negative peak amplitude. Therefore, the time $T_8$ occurs during the first phase of the clock signal CLK. The combination of the bias provided to the Josephson junctions $JJ_{0\_1}$ and $JJ_{0\_2}$ from the positive amplitude of the first clock signal $CLK_0$ and the bias current $IB_1$ can be sufficient to trigger the Josephson junctions $JJ_{0\_1}$ and $JJ_{0\_2}$. Therefore, at the time $T_8$, an RQL pulse is provided as the first superconducting data signal $DS_1$. As a result, the first superconducting data signal $DS_1$ is provided to the superconducting circuit 106 at the first data state at the time $T_8$.

The example of FIG. 4 thus demonstrates the manner in which the first and second superconducting data signals $DS_1$ and $DS_2$ are provided in the first and second data states. Accordingly, the first and second superconducting data signals $DS_1$ and $DS_2$ can be implemented by the superconducting circuit 106 to perform an operational function based on the first and second superconducting data signals $DS_1$ and $DS_2$.

Figure 5:
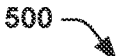
FIG. 5 illustrates another example block diagram of a superconducting data system.
Figure 5:
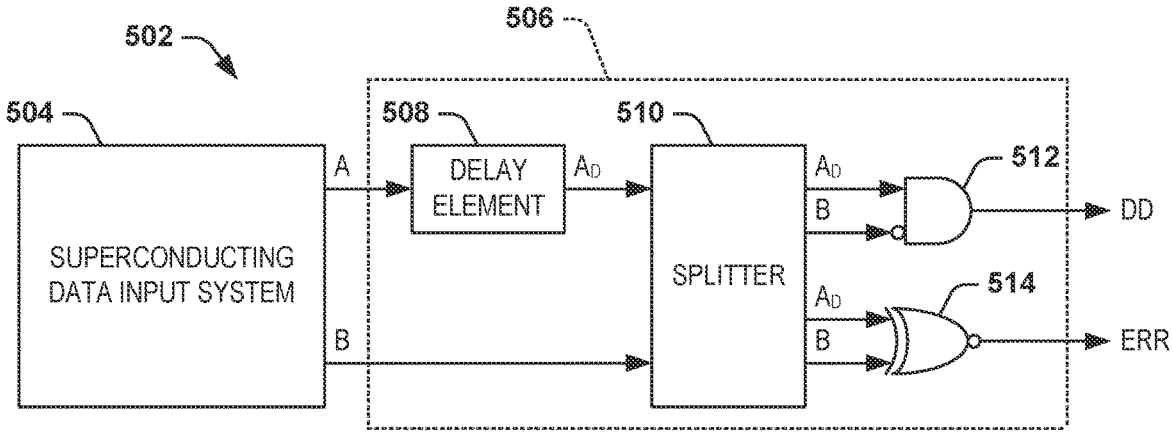

FIG. 5 illustrates another example block diagram 500 of a superconducting data system 502. The superconducting data system 502 can be configured as or similar to the superconducting data system 100. Therefore, reference is to be made to the examples of FIGS. 1-4 in the following description of the example of FIG. 5.

The superconducting data system 502 includes a superconducting data input system 504 and a superconducting circuit 506. The superconducting data input system 504 can correspond to the superconducting data input systems 104 and 200 in the examples of FIGS. 1 and 2. Therefore, the superconducting data input system 504 is configured to provide double data rate communication of first and second superconducting data signals, demonstrated in the example of FIG. 5 as a first superconducting data signal A and a second superconducting data signal B, in response to current pulses or no current pulses provided from a pulse generator (not shown). The first and second superconducting data signal A and B can be provided as an RQL pulse in a first data state, or no RQL pulse in a second data state. The superconducting circuit 506 is demonstrated in the example of FIG. 5 as a Manchester decoder, as described in greater detail herein. The Manchester decoder is one example application of the double data rate capability of the superconducting data input system 504.

The superconducting circuit 506 includes a delay element 508 configured to provide a phase delay of the first superconducting data signal A. The delay element 508 thus provides a first superconducting data signal AD corresponding to the phase-delayed first superconducting data signal A. For example, the phase delay can be 180°, such that the first superconducting data signal A and the second superconducting data signal B can be time-aligned. The time-aligned first and second superconducting data signals AD and B are provided to a signal splitter 510. The signal splitter 510 is configured to split each of the first and second superconducting data signals AD and B into a pair of superconducting data signals. Therefore, the signal splitter 510 can generate a first set of first and second superconducting data signals AD and B and a second set of first and second superconducting data signals AD and B.

The first set of first and second superconducting data signals AD and B are provided to a logic-AND gate 512. The logic-AND gate 512 includes a non-inverting input that receives the first superconducting data signal AD and an inverting input that receives the second superconducting data signal B. The logic-AND gate 512 is configured to implement a logic-AND operation to generate a decoded data output signal DD corresponding to decoded Manchester data. The second set of first and second superconducting data signals AD and B are provided to a logic-XNOR gate 514. The logic-XNOR gate 514 includes a first input that receives the first superconducting data signal AD and a second input that receives the second superconducting data signal B. The logic-XNOR gate 514 is configured to implement a logic-XOR operation and invert the output. In the example of FIG. 5, the logic-XNOR gate 514 generates an error signal ERR corresponding to "don't care" data.

The diagram 500 also includes a truth table 516 for decoding Manchester encoded data. The truth table 516 demonstrates that logic values of the decoded data output signal DD and the error signal ERR based on the logic values of the superconducting data signals A and B. As a first example, for the first superconducting data signal A to be logic-1 and the second superconducting data signal B to be logic-1, the decoded data output signal DD is provided as logic-0 and the error signal ERR is provided as logic-1. As a second example, for the first superconducting data signal A to be logic-1 and the second superconducting data signal B to be logic-0, the decoded data output signal DD is provided as logic-1 and the error signal ERR is provided as logic-0. As a third example, for the first superconducting data signal A to be logic-0 and the second superconducting data signal B to be logic-1, the decoded data output signal DD is provided as logic-0 and the error signal ERR is provided as logic-0. As a fourth example, for the first superconducting data signal A to be logic-0 and the second superconducting data signal B to be logic-0, the decoded data output signal DD is provided as logic-0 and the error signal ERR is provided as logic-1.

Therefore, as demonstrated in the example of FIG. 5, the superconducting data system 502 can implement the double data rate with respect to the first and second superconducting data signals A and B to implement Manchester decoding. Thus, the first and second superconducting data signals A and B being provided as asynchronous inputs can provide for the superconducting data system 502 to decode a Manchester encoded signal at twice the frequency of the clock signal CLK. Conventional Manchester decoding in RQL typically provides Manchester decoding twice as slowly as the superconducting data system 502, and can implement more circuitry (e.g., slightly more JTLs) due to having a single input data rate. Accordingly, the double data rate of the superconducting data system 502 is capable of providing more time efficient superconducting operations, such as Manchester decoding.

In view of the foregoing structural and functional features described above, a methodology in accordance with various aspects of the disclosure will be better appreciated with reference to FIG. 6. It is to be understood and appreciated that the method of FIG. 6 is not limited by the illustrated order, as some aspects could, in accordance with the present disclosure, occur in different orders and/or concurrently with other aspects from that shown and described herein. Moreover, not all illustrated features may be required to implement a methodology in accordance with an aspect of the present examples.

FIG. 6 illustrates an example of a method 600 for generating superconducting data (e.g., the first and second superconducting data signals $DS_1$ and $DS_2$). At 602, a clock signal (e.g., the clock signal CLK) is provided to a pulse generator (e.g., the pulse generator 102) and to a superconducting data input system (e.g., the superconducting data input system 104). At 604, a current pulse (e.g., the current pulse PLS) is provided from the pulse generator to the superconducting data input system or is not provided from the pulse generator to the superconducting data input system at each of a first phase of the clock signal and a second phase of the clock signal. At 606, a first superconducting data signal is provided from the superconducting data input system at the first phase of the clock signal. The first superconducting data signal has a first data state in response to the current pulse being provided at the first phase of the clock signal and has a second data state in response to the current pulse not being provided at the first phase of the clock signal. At 608, a second superconducting data signal is provided from the superconducting data input system at the second phase of the clock signal that is opposite the first phase of the clock signal. The second superconducting data signal has the first data state in response to the current pulse being provided at the second phase of the clock signal and has the second data state in response to the current pulse not being provided at the second phase of the clock signal.

What have been described above are examples of the present invention. It is, of course, not possible to describe every conceivable combination of components or methodologies for purposes of describing the present invention, but one of ordinary skill in the art will recognize that many further combinations and permutations of the present invention are possible. Accordingly, the present invention is intended to embrace all such alterations, modifications and variations that fall within the spirit and scope of the appended claims. Additionally, where the disclosure or claims recite "a," "an," "a first," or "another" element, or the equivalent thereof, it should be interpreted to include one or more than one such element, neither requiring nor excluding two or more such elements. As used herein, the term "includes" means includes but not limited to, and the term "including" means including but not limited to. The term "based on" means based at least in part on.

What is claimed is:

1. A superconducting data input system comprising:
an inductive coupler that generates a first bias current and a second bias current in response to receiving a current pulse;
a first clocked receiver configured to generate a first superconducting data signal having a first data state in response to the first bias current at a first phase of a clock signal and having a second data state in response to not receiving the first bias current at the first phase of the clock signal; and
a second clocked receiver configured to generate a second superconducting data signal having the first data state in response to the second bias current at a second phase of the clock signal different from the first phase, and having the second data state in response to not receiving the second bias current at the second phase of the clock signal.

2. The system of claim 1, wherein each of the first and second clocked receivers are arranged as a Josephson transmission line (JTL).

3. The system of claim 1, wherein the second phase of the clock signal is an opposite phase of the first phase of the clock signal.

4. The system of claim 1, wherein the inductive coupler comprises:
a first inductive coupling coupled to the first clocked receiver to inductively generate the first bias current in response to the current pulse; and
a second inductive coupling coupled to the second clocked receiver to inductively generate the second bias current in response to the current pulse.

5. The system of claim 1,
wherein the first clocked receiver generates the first superconducting data signal as a first reciprocal quantum logic (RQL) pulse in response to the first bias current at the first phase of the clock signal to indicate the first data state, and does not generate the first RQL pulse in response to not receiving the first bias current at the first phase of the clock signal to indicate the second data state,
wherein the second clocked receiver generates the second superconducting data signal as a second RQL pulse in response to the second bias current at the second phase of the clock signal to indicate the first data state, and does not generate the second RQL pulse in response to not receiving the second bias current at the second phase of the clock signal to indicate the second data state.

6. A superconducting circuit system comprising the superconducting data input system of claim 1, the superconducting circuit system further comprising:
a pulse generator that generates the current pulse; and
a superconducting circuit that receives the first and second superconducting data signals.

7. The superconducting circuit system of claim 6, wherein the superconducting data input system and the superconducting circuit are arranged in a cryogenic environment, and wherein the pulse generator is arranged in a room temperature environment.

8. The superconducting circuit system of claim 6, wherein the pulse generator operates based on the clock signal, such that the current pulse is approximately aligned to an approximately center of one of the first phase and the second phase of the clock signal each time the pulse generator provides the current pulse to indicate the first data state.

9. The superconducting circuit system of claim 8, wherein the superconducting circuit comprises an alignment circuit that receives at least one of the first and second superconducting data signals in the first data state and provides an alignment signal to the pulse generator to align timing of the current pulse to each of the first and second phases of the clock signal.

10. The superconducting circuit system of claim 6, wherein the superconducting circuit comprises a Manchester decoding circuit configured to provide a Manchester decoded output in response to the first and second superconducting data signals.

11. A method for generating superconducting data, the method comprising:
providing a clock signal to a pulse generator and to a superconducting data input system;

providing a current pulse from the pulse generator to the superconducting data input system or not providing the current pulse from the pulse generator to the superconducting data input system at each of a first phase of the clock signal and a second phase of the clock signal;

providing a first superconducting data signal from the superconducting data input system at the first phase of the clock signal, the first superconducting data signal having a first data state in response to the current pulse being provided at the first phase of the clock signal and having a second data state in response to the current pulse not being provided at the first phase of the clock signal; and providing a second superconducting data signal from the superconducting data input system at the second phase of the clock signal that is opposite the first phase of the clock signal, the second superconducting data signal having the first data state in response to the current pulse being provided at the second phase of the clock signal and having the second data state in response to the current pulse not being provided at the second phase of the clock signal.

12. The method of claim 11, wherein providing the first superconducting data signal comprises:

generating a first reciprocal quantum logic (RQL) pulse via a first Josephson transmission line (JTL) in response to the current pulse being provided at the first phase of the clock signal to provide the first superconducting data signal in the first data state, the first JTL being biased by the first phase of the clock signal; and not generating the first RQL pulse via the first JTL in response to the current pulse not being provided at the first phase of the clock signal to provide the first superconducting data signal in the second data state, wherein providing the second superconducting data signal comprises:

generating a second RQL pulse via a second JTL in response to the current pulse being provided at the first phase of the clock signal to provide the second superconducting data signal in the first data state, the second JTL being biased by the second phase of the clock signal; and not generating the second RQL pulse via the second JTL in response to the current pulse not being provided at the second phase of the clock signal to provide the second superconducting data signal in the second data state.

13. The method of claim 12, further comprising providing a direct current (DC) bias to the clock signal sufficient to trigger at least one Josephson junction associated with the first and second JTLs along an approximately 180° phase window centered at a peak amplitude of the clock signal in each of the first and second phases of the clock signal, respectively.

14. The method of claim 11, wherein providing the current pulse comprises:

inductively generating a first bias current via an inductive coupler of the superconducting data input system in response to the current pulse being provided to the superconducting data input system at the first phase of the clock signal, wherein first superconducting data signal is generated in the first data state in response to the first bias current and the first phase of the clock signal; and inductively generating a second bias current via the inductive coupler in response to the current pulse being provided to the superconducting data input system at the second phase of the clock signal, wherein second superconducting data signal is generated in the first data state in response to the second bias current and the second phase of the clock signal.

15. The method of claim 11, further comprising:
providing an initial current pulse via the pulse generator;
receiving at least one of the first and second superconducting data signals at an alignment circuit; and
providing an alignment signal to the pulse generator to align timing of the current pulse approximately centered on the first and second phases of the clock signal each time the pulse generator provides the current pulse to indicate the first data state.

16. A superconducting circuit system comprising:
a pulse generator that generates a current pulse or does not generate the current pulse at each of a first phase of the clock signal and a second phase of the clock signal that is opposite the first phase;
a superconducting circuit; and
a superconducting data input system comprising:
an inductive coupler that generates a first bias current and a second bias current in response to receiving the current pulse;
a first clocked receiver configured to provide a first superconducting data signal to the superconducting circuit, the first superconducting data signal having a first data state in response to the first bias current at the first phase of the clock signal and having a second data state in response to not receiving the first bias current at the first phase of the clock signal; and
a second clocked receiver configured to provide a second superconducting data signal to the superconducting circuit, the second superconducting data signal having the first data state in response to the second bias current at the second phase of the clock signal, and having the second data state in response to not receiving the second bias current at the second phase of the clock signal.

17. The system of claim 16, wherein each of the first and second clocked receivers are arranged as a Josephson transmission line (JTL), wherein the first clocked receiver generates the first superconducting data signal as a first reciprocal quantum logic (RQL) pulse in response to the first bias current at the first phase of the clock signal to indicate the first data state, and does not generate the first RQL pulse in response to not receiving the first bias current at the first phase of the clock signal to indicate the second data state, wherein the second clocked receiver generates the second superconducting data signal as a second RQL pulse in response to the second bias current at the second phase of the clock signal to indicate the first data state, and does not generate the second RQL pulse in response to not receiving the second bias current at the second phase of the clock signal to indicate the second data state.

18. The system of claim 16, wherein the superconducting data input system and the superconducting circuit are arranged in a cryogenic environment, and wherein the pulse generator is arranged in a room temperature environment.

19. The system of claim 16, wherein the pulse generator operates based on the clock signal, wherein the superconducting circuit comprises an alignment circuit that receives at least one of the first and second superconducting data signals in the first data state and provides an alignment signal to the pulse generator to align timing of the current pulse to an approximate center of each of the first and second phases of the clock signal each time the pulse generator provides the current pulse to indicate the first data state.

20. The system of claim 16, wherein the superconducting circuit comprises a Manchester decoding circuit configured to provide a Manchester decoded output in response to the first and second superconducting data signals.

\* \* \* \* \*